(12) United States Patent
Loraing

(10) Patent No.: US 8,974,085 B2
(45) Date of Patent: Mar. 10, 2015

(54) LIGHTING UNIT

(75) Inventor: Daniela Maria Loraing, Karlsruhe (DE)

(73) Assignee: Koninklijke Philips N.V., Eindhoven (NL)

( * ) Notice: Subject to any disclaimer, the term of this patent is extended or adjusted under 35 U.S.C. 154(b) by 332 days.

(21) Appl. No.: 13/319,117

(22) PCT Filed: Apr. 30, 2010

(86) PCT No.: PCT/IB2010/051898
§ 371 (c)(1),
(2), (4) Date: Nov. 7, 2011

(87) PCT Pub. No.: WO2010/128440
PCT Pub. Date: Nov. 11, 2010

(65) Prior Publication Data
US 2012/0057349 A1 Mar. 8, 2012

(30) Foreign Application Priority Data
May 8, 2009 (EP) .................................... 09159773

(51) Int. Cl.
*F21S 4/00* (2006.01)
*F21S 2/00* (2006.01)
*F21V 23/06* (2006.01)
*F21Y 105/00* (2006.01)

(52) U.S. Cl.
CPC .................. *F21S 2/005* (2013.01); *F21V 23/06* (2013.01); *F21Y 2105/008* (2013.01)
USPC ....... 362/249.14; 362/382; 362/646; 362/652

(58) Field of Classification Search
USPC .......... 362/249.01, 249.02, 249.14, 368, 382, 362/396, 646, 647, 652, 653; 315/312, 324
See application file for complete search history.

(56) References Cited

U.S. PATENT DOCUMENTS

| | | | | |
|---|---|---|---|---|
| 5,628,557 A | * | 5/1997 | Huang | ...................... 362/249.14 |
| 6,793,369 B2 | * | 9/2004 | Calzaretta et al. | ............. 362/219 |
| 7,290,922 B2 | * | 11/2007 | Scalfi | ............................. 362/647 |
| 7,348,738 B2 | | 3/2008 | Foust et al. | |
| 7,498,603 B2 | | 3/2009 | Rogojevic et al. | |
| 8,111,022 B2 | * | 2/2012 | Snijder et al. | .................. 315/312 |
| 8,362,715 B2 | * | 1/2013 | Snijder et al. | .................. 315/312 |

(Continued)

FOREIGN PATENT DOCUMENTS

| | | |
|---|---|---|
| EP | 2012054 A2 | 1/2009 |
| WO | 2007069130 A2 | 6/2007 |

*Primary Examiner* — John A Ward
(74) *Attorney, Agent, or Firm* — Meenakshy Chakravorty

(57) ABSTRACT

The invention describes a lighting unit (1), comprising a plurality of lighting modules (10) and a number of connecting elements (2) with coupling means (21, 22), wherein each lighting element (10) comprises at least one planar light-emitting element (11) in an enclosure (12) and a number of counter-coupling means ($J_1$, $J_2$) arranged along at least one edge of the enclosure (12); and wherein neighboring lighting modules (10) are coupled together detachably by means of at least one connecting element (2) such that the light-emitting element (11) of a first lighting module (10) is electrically connected to the light-emitting element (11) of a second lighting module (10) by an interaction of at least part of the coupling means (21, 22) of the connecting element (2) and at least part of the counter-coupling means ($J_1$, $J_2$) of the corresponding lighting modules (10). The invention also describes a connecting element (2) and a lighting module (10) for assembling such a lighting unit (1).

27 Claims, 8 Drawing Sheets

(56) References Cited

U.S. PATENT DOCUMENTS

| | | | |
|---|---|---|---|
| 8,475,000 B2 * | 7/2013 | Tamai | 362/249.04 |
| 2005/0248935 A1 | 11/2005 | Strip et al. | |
| 2006/0285361 A1 | 12/2006 | Cok | |
| 2008/0037284 A1 | 2/2008 | Rudisill | |
| 2009/0097242 A1 | 4/2009 | Hsieh et al. | |

* cited by examiner

LIGHTING UNIT

FIELD OF THE INVENTION

The invention describes a lighting unit, a connecting element, and a lighting module.

BACKGROUND OF THE INVENTION

In modern-day lighting solutions, many different types of lighting arrangements are possible owing to the different types of light source such as incandescent bulbs, fluorescent tubes, light-emitting diodes, etc., and the different ways in which these can be incorporated into lighting units. Also, a trend towards more individuality is noticeable, so that a demand for more unconventional types of lighting systems may be observed, for example modular lighting arrangements that can be assembled in different ways. Conventional modular lighting systems, using light sources such as incandescent bulbs, may be disassembled and re-assembled to take on another form, but this is generally a cumbersome undertaking. Furthermore, since these lighting systems are heavy owing to the number of light sources and cables included, they generally, once assembled, remain as a permanent fixture, so that their inherently modular nature cannot be truly exploited. Furthermore, these types of lighting system are often prohibitively expensive for the average consumer.

SUMMARY OF THE INVENTION

It is therefore an object of the invention to provide an alternative and improved modular lighting means.

The object of the invention is achieved by a lighting unit according to claim 1, by a connector according to claim 12, and by a lighting module according to claim 14.

According to the invention, the lighting unit, or luminaire, comprises a plurality of lighting modules and a number of connecting elements with coupling means. Each lighting module comprises at least one essentially planar light-emitting element in an enclosure and a number of counter-coupling means arranged along at least one edge of the enclosure. Neighbouring, or adjacent, lighting modules are coupled together physically and detachably, i.e. so that they can be separated from each other again, by means of at least one connecting element such that the light-emitting element of a first lighting module is electrically connected to the light-emitting element of a second lighting module by an interaction of at least part of the coupling means of the connecting element and at least part of the counter-coupling means of the corresponding lighting modules.

The 'enclosure' of the lighting module serves to contain the planar light-emitting element and provide a frame or edging with a number of edges or sides (as opposed to faces) along which the counter-coupling means are arranged. Evidently, the enclosure can have any shape, for example it may be triangular, square, or even round in shape. Since the light-emitting element of the lighting unit according to the invention is planar, or flat, or essentially two-dimensional in appearance, the enclosure itself can also essentially be 'flat' in shape.

One advantage of using an essentially planar light emitting element in a lighting module according to the invention is that essentially the entire surface of the lighting module can act to emit light. The 'planar' light-emitting element can be flat, or have a flat light-emitting surface, but is not limited to being flat. For example, the light-emitting element could have a curved surface.

The lighting unit according to the invention allows a simple and convenient way of connecting lighting modules together to give a modular luminaire, since any two lighting modules of the luminaire can be connected together by means of a connecting element, and can be simply disconnected, or detached, again as required. A lighting module can be connected to one or more additional lighting modules. Since each lighting module can have a plurality of counter-coupling means, the lighting modules can be combined in two-dimensional or three-dimensional structures, or a structure combining two- and three-dimensional regions or sections. In this way, the luminaire according to the invention can be assembled in any of a wide variety of forms, with any number of light-emitting surface faces. Furthermore, by using relatively thin lighting modules, a lighting unit with an overall low weight can be achieved, even when many lighting modules are coupled together.

According to the invention, a connecting element for connecting two spatially independent electrical modules—in particular lighting modules—comprises a first coupling means, a second coupling means and a body, and is realized such that the coupling means are at least partially enclosed by the body and can be pressed together to decrease a distance between the coupling means. The coupling means are realized to allow a physical coupling of neighbouring modules, and—optionally—to allow an electrical connection between neighbouring modules. In other words, of the two coupling means, it is sufficient for one coupling means to be able to make an electrical connection, while both coupling means serve to physically couple the neighbouring modules. The 'body' essentially serves to provide the coupling means with a certain stability. The body also provides ease of use, so that a user, by simply pressing or squeezing the body, can lessen the distance between the coupling means so that these can be connected to or "docked" with the counter-coupling means of the lighting module, allowing two lighting modules to easily be connected to each other or disconnected from each other (electrically or physically), without having to bend the connecting element or otherwise subject it, the coupling means, or the counter coupling means to any undue strain. The connecting element therefore allows a very easy and convenient means of assembling a luminaire to give a desired form. Further aspects of the connecting element will be explained in greater detail below.

According to the invention, a lighting module comprises at least one essentially planar light-emitting element in an enclosure, and a number of counter-coupling means arranged along at least one edge of the enclosure. A counter-coupling means of the lighting module is thereby electrically connected to the light-emitting element and is realized to accommodate a coupling means of a connecting element, in particular a connecting element as described above, so that the light-emitting region of one lighting module can be directly connected to the light-emitting region of a neighbouring lighting module.

Using only two types of element—a lighting module and a connecting element—a luminaire in essentially any desired shape or form can easily be assembled by a user without the need of any tools. Furthermore, since the lighting modules are connected in the simple modular manner described, a luminaire can be extended or re-assembled in a different configuration at any time. Also, a user can purchase additional lighting modules and connecting elements to add to an existing luminaire when it suits him.

The dependent claims and the subsequent description disclose particularly advantageous embodiments and features of the invention.

The counter-coupling means of the lighting modules and the coupling means of the connecting elements of the luminaire according to the invention can be connected in any suitable way. For example, the coupling means and the counter-coupling means can be realized to "dock" together in a direction essentially perpendicular to the side of the lighting module, i.e. by laterally pressing the coupling means of a connecting element onto a counter-coupling means of the lighting module. In a most particularly preferred embodiment of the invention, however, a counter-coupling means of a lighting module is most preferably arranged on a side of the lighting module in such a way that a coupling axis of the counter-coupling means is essentially parallel to the side of the lighting module.

The term 'coupling axis' is to be understood to be the axis along which a coupling or joining is effected between the coupling means of the connecting element and the counter-coupling means of the lighting module. Using an everyday example, the direction in which a stereo plug is inserted into a stereo jack is the 'coupling axis' for that type of connection. In the luminaire according to the invention, then, the counter-coupling means of a lighting module are arranged on the outside of the lighting module enclosure so that the coupling element can be connected to the counter-coupling means in a direction essentially parallel to the edge of the enclosure. The term 'parallel to' in used in the usual sense, so that, in the case of an enclosure with essentially straight edges, the coupling axis lies on a virtual line that is essentially parallel to the enclosure edge. In the case of an enclosure with curved edges, the coupling axis lies on a virtual line that is essentially parallel to a tangent to the edge of the enclosure at the point of connection. This particularly preferred configuration of the counter-coupling means and the coupling means allows a certain freedom of movement about an axis parallel to the edge of a lighting module, e.g. a rotation of the lighting module along the coupling axis. For example, two neighbouring lighting modules can be connected so that they are at an angle to one another, thus allowing the construction of a three-dimensional luminaire. Essentially unlimited possibilities in the assembly of the luminaire according to the invention are thus given by the characteristics described above.

A lighting module for such a luminaire then, as already described, comprises at least one light-emitting element and a number of counter-coupling means, whereby a counter-coupling means of the lighting module is most particularly preferably arranged on a side of the lighting module such that a coupling axis of the counter-coupling means is essentially parallel to the side of the lighting module. The lighting modules of a luminaire according to the invention can be of different shapes and sizes, or may all have the same shape and size.

A counter-coupling means of a lighting module can be arranged in any suitable manner on the side of the enclosure of the lighting module, for example it can be mounted on the top, bottom, or outside edge of the enclosure. However, for reasons of stability, the counter-coupling means is preferably arranged so that it does not protrude beyond an outermost contour of the lighting module. To this end, the sides of the lighting module enclosure can comprise one or more recesses or indentations to accommodate the counter-coupling means of the lighting module. By appropriate design of the connecting elements and appropriate placement of the counter-coupling means in the enclosure of the lighting module, the actual coupling or connection between the coupling elements and the counter-coupling means can take place within such a recess or indentation. To this end, the counter-coupling means can be situated in the recess, for example such that the two counter-coupling means of a pair of counter-coupling means face each other across the recess.

Usually, to distinguish between the different connector types, these are usually referred to as 'male' or 'female' depending on their shape. A stereo plug, for example, is a 'male' connector while a stereo socket or jack is a 'female' connector. The coupling elements of the lighting unit according to the invention can be male or female, and the counter-coupling means are then female or male, respectively. Using the example of a stereo jack, which is usually incorporated in a housing of a device so that the opening is flush with the outside of the device, a female counter-coupling means(s) of the lighting module could be incorporated in the enclosure so that the opening of the socket is flush with the outside surface of the enclosure.

The light-emitting element of a lighting module can comprise any suitable light-emitting element that can be realized to have an essentially planar form. However, since developments in the field of organic light-emitting diodes are making it possible to economically manufacture relatively large and efficient OLEDs, a lighting module of a lighting unit according to the invention preferably comprises one or more OLEDs. In the following, therefore, a light-emitting element of a lighting module may simply be referred to as an 'OLED element' or even 'OLED', without restricting the invention in any way. The area of the lighting module can be chosen to suit the type of light-emitting element used. For example, a lighting module may have a surface area of several square centimeters. Evidently, when larger light-emitting elements are used, the area of the lighting module can be made larger accordingly.

The enclosure of a lighting module according to the invention preferably comprises a frame or surround to hold or enclose the OLED structure. An OLED is generally manufactured by depositing the organic material on a substrate such as glass, and this substrate can act as an 'outside face' of the enclosure. OLEDs may not be exposed to moisture and/or oxygen, which would result in a deterioration or even failure of the OLED. Therefore, OLEDs are encapsulated in a gastight manner, e.g. with a metal cover or lid, sealed to the glass substrate with a suitable glass frit, so that no part of the OLED is exposed along the sides. In such a realisation, the OLED emits light only through the substrate. Alternatively, the encapsulation may be transparent, e.g. with a second glass sheet sealed to the glass substrate. In this case, the OLED can emit light through both faces, and a luminaire assembled using such lighting modules also emits light on both sides. In a further embodiment of such lighting modules, one of the sides may comprise a filter of coloured glass or other suitable material to vary the colour of the emitted light. For such lighting modules using previously encapsulated OLEDs, the enclosure need only comprise a frame to surround or enclose the outer edges of the OLED. The enclosure can serve to provide the light-emitting element with a certain stability, and to protect it, in particular any corners, from damage. The material of the frame can be, for example, a suitable plastic material that can be moulded into the desired shape. One suitable type of plastic is Terblend®, which is light but rigid, is robust, and has favourable haptic properties. The frame can comprise two or more parts, for example an upper part and a lower part, shaped to fit around the OLED 'sandwich' in a snug manner, and realized to be fastened together such that the frame parts cannot be inadvertently opened again. For example, a type of snap-fastening could be used. A more permanent seal could be achieved by glueing the upper and lower frame parts together to enclose the OLED. If necessary, the hermetic seal given by the frame of the enclosure could be augmented by foaming, for example with a suitable polyurethane foam.

A stable connection between lighting modules of a luminaire is desirable, so that the assembled luminaire retains its shape, even when, for example, it is suspended from a ceiling and subjected to the pull of gravity. To some extent, the stability of a lighting unit can be given by appropriate design of the enclosure shape and dimensions. For instance, by designing the enclosure and the connecting element so that the enclosures of neighbouring lighting modules touch each other at one or more points along their edges, an assembled luminaire may retain its shape owing in part to the friction at the points of contact between the enclosure edges. Evidently, the stability of the construction can further be increased when the number of coupling points is increased. Therefore, in a luminaire according to the invention, a lighting module preferably comprises at least one pair of counter-coupling means arranged on a side of the lighting module. A 'pair of counter-coupling means' is to be understood to mean two counter-coupling means, arranged close together, and intended for 'docking' or coupling with two corresponding coupling elements of a connecting element. In the case of a lighting module with a polygonal shape, the lighting module can have at least one such pair of counter-coupling means on each of its edges. Generally, it can be expected that one pair of counter-coupling means on each side of the lighting module may be sufficient to ensure a satisfactory stability of the overall construction. For lighting modules with a triangular shape, then, each lighting module could have three pairs of counter-coupling means, one pair on each of its edges.

Therefore, in a preferred embodiment of the lighting unit according to the invention, the connecting element preferably comprises a pair of coupling means, each of which comprises two coupling terminals and whereby two coupling terminals of the different coupling means are arranged on a shared side of the connecting element and are allocated to a pair of counter-coupling means of a lighting module. In other words, the two coupling terminals (of different coupling means) found on the side of the connecting element adjacent to the side of the lighting module are allocated to the pair of counter-coupling means on that side of the lighting module.

In a further preferred embodiment of the lighting unit according to the invention, the counter-coupling means of a pair of counter-coupling means of a lighting module and the coupling means of a connecting element are arranged such that a first coupling direction between a coupling terminal of the first coupling means and a first counter-coupling means of the pair is essentially anti-parallel to a second coupling direction between the coupling terminal of the second coupling means and the second counter-coupling means. Preferably, the two coupling directions lie essentially on the same virtual line or coupling axis, i.e. the two coupling directions are preferably co-axial.

In a further preferred embodiment, a coupling means of a connecting element comprises two coupling terminals joined by a curved midsection so that the coupling means has a "U" shape, and the two coupling terminals of a coupling means are arranged essentially parallel to each other. In this way, two lighting modules can be connected by means of their respective pairs of counter-coupling means and a connecting element such that the lighting modules are held close together and can be arranged in a planar manner, or at an angle to one another to allow a three-dimensional structure to be assembled. The curved shape of the coupling means and the manner in which the coupling means are connected to the counter-coupling means result in a favourable distribution of the forces involved. For example, when two lighting modules are joined by a connecting element, they cannot easily be inadvertently pulled apart in a lateral manner, since each coupling means acts as a type of spring to hold the lighting modules together.

As already mentioned above, the counter-coupling means can be a 'male' type connector or a 'female' type connector. In this type of luminaire with lighting modules having a recess for each pair of counter-coupling means, it may be more convenient to utilize a 'female' type connector for the counter-coupling means, since any protruding 'male' type connector might be more prone to damage when lighting modules are being connected together. Therefore, in a further preferred embodiment of the lighting unit according to the invention, a counter-coupling means of a lighting module comprises a socket with a first electrical contact and a second electrical contact, which socket is arranged in the enclosure of the lighting module such that the first electrical contact is connected to a first electrode of the light-emitting element, and the second electrical contact is connected to a second electrode of the light-emitting element. The 'socket' can be a proprietary connector designed specifically for the luminaire, or may be a connector in the manner of a stereo jack, which is well known and available in different sizes. For example, miniature stereo jacks are available, which, owing to their small dimensions, can be relatively easily built into the enclosure of the lighting module.

In the above, reference has been made to pairs of counter-coupling means, and connecting elements with two coupling means, and to electrical connections made between coupling means and counter-coupling means. However, it may not always be desirable or necessary for an electrical connection to be made. In the case of counter-coupling means or coupling means that are expensive or complicated to manufacture, it may be preferable that only one counter-coupling means of a pair of counter-coupling means is realized to actually allow an electrical connection. Similarly, a connecting element may only comprise one electrically conductive coupling means, while the other serves only to physically connect neighbouring lighting modules. For example, one of the coupling means of a connecting element may simply be made of plastic or some other non-conducting and economical material. Equally, one of the pair of counter-coupling means may simply allow a physical connection or "docking" to a coupling terminal of a coupling means, without any electrical connection taking place. However, connecting elements and lighting modules made in this way would require the user to be aware of which counter-coupling means and which coupling means are 'real' and which are 'fake' or 'dummy', so that he can assemble a functional luminaire in which all lighting modules are electrically connected to each other. Therefore, in a preferred embodiment of the lighting unit according to the invention, both counter-coupling means of a pair of counter-coupling means and both coupling means of a connecting element are realized as electrical connectors.

As mentioned above, the connecting element comprises two coupling means and a body which can be compressed to decrease a distance between the coupling means. To allow this "squeezing", the body of the connecting element could incorporate a spring, such as a spring in annular form, situated between the coupling means, that can be compressed to reduce the distance between the coupling means, and that returns to its original shape after being released. In a preferred embodiment, however, the body of a connecting element according to the invention therefore preferably comprises an elastic material, so that the body is at least partially made of the elastic material. A suitable choice of material might be a thermoplastic elastomer (TPE), which is easily manufactured and has favourable tactile properties. For example, the body of a connecting element, when made of TPE, can easily and comfortably be compressed or squeezed to reduce the distance between the coupling means, and returns to its original shape when released. The body can be solid, or may comprise an opening such as a slit across the entire width of the body between the regions of the coupling means enclosed within the body. Such a transverse opening across the width of the body of the connecting element allows a particularly easy compression of the body, thus permitting an easy assembly of the luminaire. This type of body design is less complicated and more economical.

The counter-coupling means of the lighting module and the coupling means of the connecting element may be realised such that one coupling means of the connecting element is used to connect the anodes of the OLEDs in adjacent lighting modules, and the other coupling means of the connecting element is used to connect the cathodes of the OLEDs. In such a realisation, single-pole connectors could be used for the coupling means. However, this realisation would require the user to know which of the counter-coupling means is connected to an anode, and which is connected to a cathode, in order for the lighting modules to be connected in the proper order. To this end, suitable markings could be applied to the terminals and the coupling means, for example by using colour coding.

In a particularly preferred embodiment of the lighting unit according to the invention, coupling means of the connecting elements and counter-coupling means of the lighting modules are realized as two-pole connectors. A first pole of the counter-coupling means of a lighting module can then be connected to the anode of the OLED, while the second pole is connected to the cathode. These connections can be made in the same manner for essentially all counter-coupling means of the lighting modules. Similarly, the coupling means of essentially all connecting elements can be realised as two-pole connectors. Preferably, the two-pole coupling means comprises an electrically conducting wire as first pole, with two ends and a coupling terminal arranged at each end, and an insulating sheath surrounding the electrically conducting wire. As second pole, the coupling means comprises an electrically conducting outer sheath surrounding the insulating sheath. The first layer of the coupling means can be, for example a copper wire. The insulating layer or sheath can be any suitable material such as plastic, while the electrically conducting outer sheath can be any suitable metal. For example, because of its corrosion-resistant properties, and because it is economical and easily available, a suitable choice of material for the outer sheath may be stainless steel. By using such two-pole connectors, a fool-proof correct assembly of the luminaire can be achieved, since it is impossible for a user to assemble the luminaire incorrectly from an electrical point of view.

Since the first electrical contact of the counter-coupling means is connected to a first electrode of the light-emitting element, and the second electrical contact of the counter-coupling means is connected to a second electrode of the light-emitting element, neighbouring lighting modules in a luminaire can conveniently be connected in a parallel connection, in which the anodes of the OLEDs in lighting modules of the luminaire are connected together, and the cathodes of the OLEDs are connected together. This feature of the luminaire according to the invention offers the undisputed advantage of being foolproof in its assembly, since (ignoring a deliberate manipulation of, for example, a connecting element) it is simply not possible for neighbouring lighting modules to be incorrectly connected. No matter which way the user holds the lighting modules or connecting means while assembling the luminaire, he will always automatically connect the elements of the luminaire in the correct way.

The physical realisation of the connecting element can contribute considerably to the stability of the connection between two lighting modules. For example, if the coupling means are sealed within the material of the body of the connecting element, these will not tend to twist or rotate with respect to the body. Furthermore, the plastic insulating 'ring', given by the region of insulating layer exposed between the coupling terminal and the outside sheath, can be gripped by the counter-coupling means of the lighting module. The elastic properties of the body and the rigid properties of the coupling means ensure that a coupling between a pair of counter-coupling means and two corresponding coupling terminals are always subject to outward or diverging forces in opposite directions along the coupling axis. At the same time, the U-shape of the two coupling means of a connecting element act to 'hold' two neighbouring lighting modules together. For these reasons, the connecting element is firmly held between adjacent lighting modules, thus lessening the likelihood that adjacent lighting modules tilt with respect to each other, particularly in a 'flat' luminaire realization, and preventing the lighting modules form being inadvertently pulled apart.

A luminaire according to the invention can also comprise modules that only serve to provide physical connections between lighting modules of the luminaire. Such 'passive' modules can be of the same shape and size as the lighting modules, and can be equipped with the same type of counter-coupling means. The counter-coupling means of the passive module can be interconnected in such a way that a passive module, positioned between lighting modules and connected to them using connecting means, allows the OLEDs of the 'active' lighting modules to be electrically connected to each other. In this way, interesting combinations of active and passive modules can be obtained in a luminaire. Such a luminaire, realised in a 'flat' embodiment and covering a relatively large area, could be used, for example, as a screen or a room divider. It is also conceivable that individual lighting modules of a luminaire could be turned on or off by including a switch for the light-emitting element, for example along the edge of an enclosure. Switching off such a lighting module would be possible, therefore, while leaving the remaining lighting modules switched on.

As will be known to the skilled person, a light-emitting element requires a particular driving unit to ensure that the light-emitting element is driven using the required or desired current, since the light output of a light-emitting element may depend on the level of current supplied. To this end, without going into any unnecessary detail, the luminaire according to the invention may also comprise a suitable driving unit and/or control unit. The luminaire may be powered by any suitable power supply. For example, the mains power supply may be converted using an AC/DC converter to obtain a direct current at the required level. Alternatively, a battery, solar cell, or other power supply may be used.

The luminaire may also comprise a control unit for regulating the current supply to the light-emitting elements of the lighting modules. For example, the control unit may allow the light-emitting elements to be dimmed Such a control unit could also activate or deactivate certain light-emitting elements regions in the luminaire, for example to alter the colour output. The manner in which this is done will be known to the skilled person and need not be discussed in any detail here. For convenience, the control unit may avail of a remote control unit to allow a user to control the light intensity and/or colour output of the luminaire by means of remote control commands.

The lighting unit according to the invention could comprise, in addition to the lighting modules and connecting elements, a further type of element realized to allow a connection to an external power source. In a preferred embodiment, however, the lighting unit comprises a connecting element, or a lighting module, adapted to allow a connection to an external power supply. For example, a lighting module could, in addition to the light-emitting element and electrodes thereof, also comprise a two-pole cable which connects the electrodes to the plus and minus terminals of a suitable power supply. Alternatively, the lighting unit might comprise a module with the same shape, appearance and counter-coupling means as a lighting module, so that this module connects the plus and minus terminals of a power source to the connecting terminals of any coupling means coupled to that module. In a further development, separate lighting units could be electrically 'strung' together, for example in the manner of lampions, by using such modules to electrically join them.

When a solar cell as power supply, this could be incorporated into a module having the same shape as the lighting modules of the luminaire, and counter-coupling means arranged around its perimeter in the same manner as described above. Such a luminaire would then be independent of any power points such as mains power supply sockets, and would not need any cable.

The light output characteristics of the OLEDs intended for a luminaire according to the invention may vary between different lighting modules and subsequently may be deliberately brought to an essentially identical level, for example by including one or more resistors in each lighting module. Such resistors could, for example, be serially placed in the anode of the OLED, incorporated in the outer rim of the enclosure.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

FIG. 1b shows an enlarged view of a counter-coupling means of the lighting module of FIG. 1a;

FIG. 3 shows the lighting module of FIG. 1a coupled to the connecting element of FIG. 2a;

FIG. 4 is an exploded view showing the constituent parts of the lighting module of FIG. 1a;

FIG. 8 shows a circuit diagram representation of a lighting unit of FIG. 5a.

In the drawings, like numbers refer to like objects throughout. Objects in the diagrams are not necessarily drawn to scale.

DETAILED DESCRIPTION OF THE EMBODIMENTS

Figure 1A:
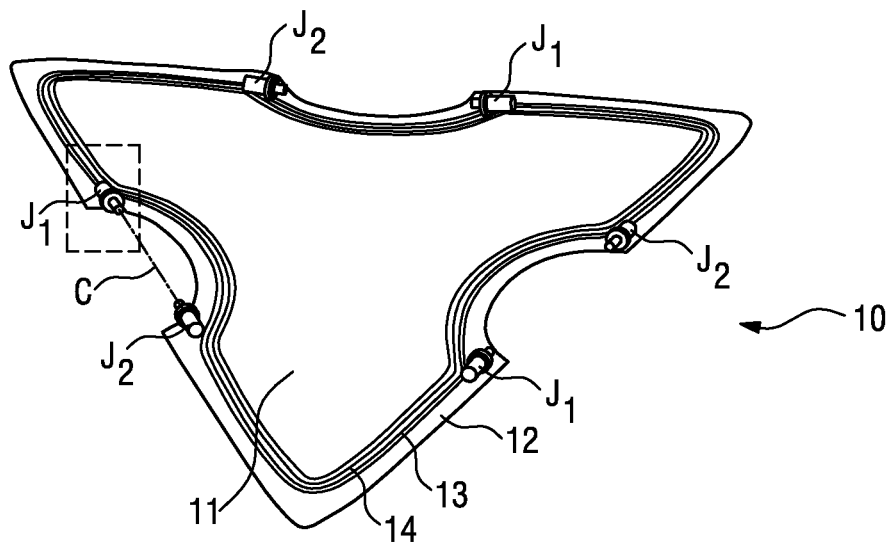
FIG. 1a shows a schematic representation of part of a lighting module according to the invention.
Figure 5A:
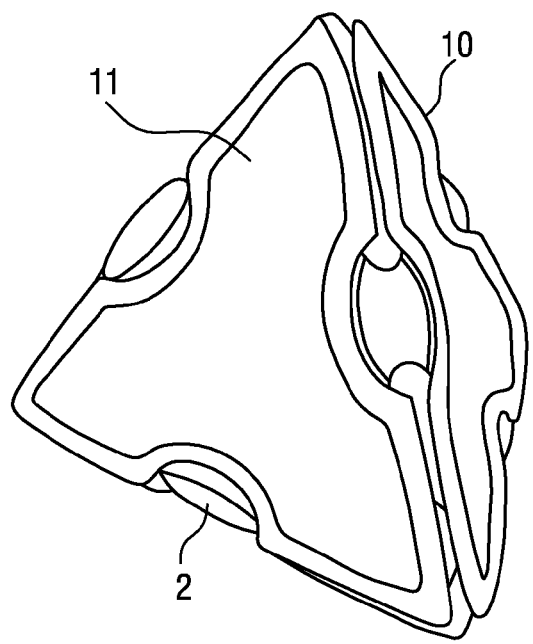
FIG. 5a shows a first embodiment of a lighting unit according to the invention, using a first type of lighting module according to FIGS. 1 to 4.
Figure 5B:
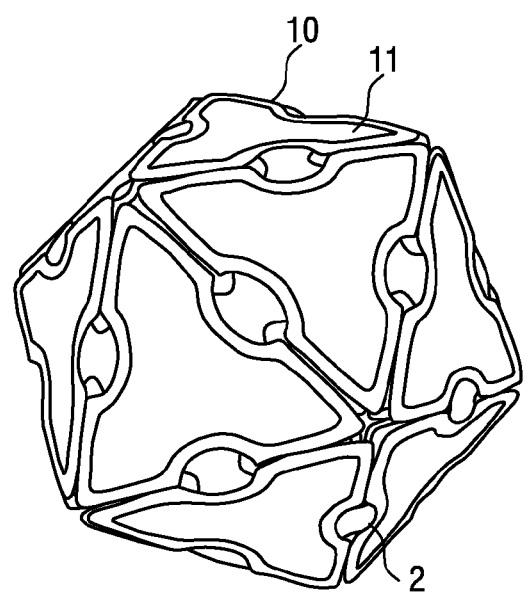
FIG. 5b shows a second embodiment of a lighting unit according to the invention using the first type of lighting module according to the invention.
Figure 5C:
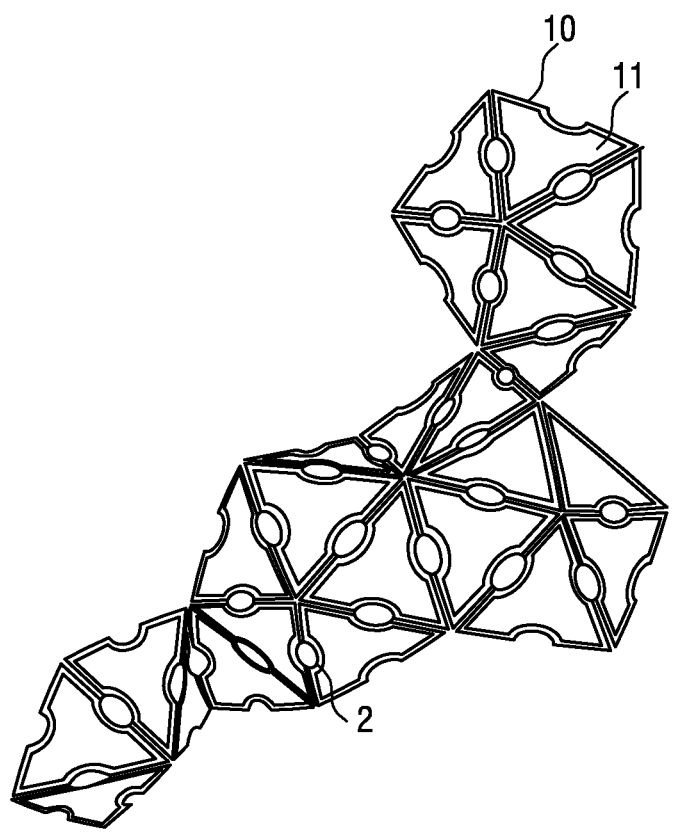
FIG. 5c shows a third embodiment of a lighting unit according to the invention using the first type of lighting module.

A schematic representation of a part of a lighting module 10 according to the invention, used to assemble the lighting units shown in FIGS. 5a-5c, is shown in FIG. 1a. To explain the construction of the lighting module 10, it is shown without an upper part of an enclosure 12. In this embodiment, the lighting module 10 is essentially triangular in shape. The lighting module 10 comprises the enclosure 12—essentially comprising a two-part frame—containing an OLED 11 which provides a light-emitting surface over almost the entire area of the lighting module 10. Since the OLED 11 can be very thin, the overall thickness of the lighting module 10 shown here can be in the region of a few millimeters. The area of the light-emitting surface can be defined by the choice of OLED type to be used. The OLED is driven by applying a potential across two electrodes—cathode and anode—in the usual manner, as will be known to the skilled person.

Figure 1B:
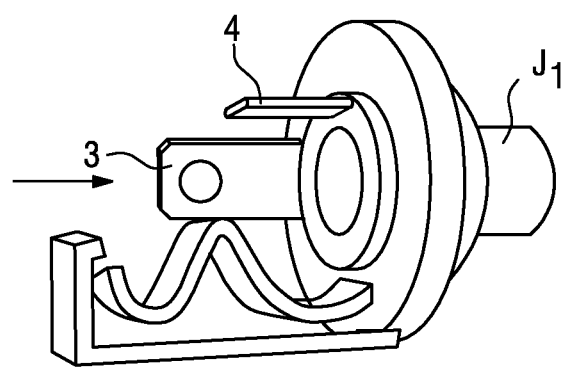

The diagram shows the triangular lighting module 10 with three recesses, one on each side, to accommodate pairs of counter-coupling means $J_1$, $J_2$. In this example, a counter-coupling means $J_1$, $J_2$ is a miniature type of jack $J_1$, $J_2$ to accommodate a corresponding miniature jack plug. Since the counter-coupling means $J_1$, $J_2$ are arranged so that they face each other across the recess, a coupling axis C lies essentially parallel to the side of the enclosure 12 virtually extended in the region of the recess, as indicated by the broken line. The jack $J_1$ in the region bounded by the broken line is shown enlarged in FIG. 1b. Here, the jack $J_1$ is a two-pole connector $J_1$ with one connection 3 to an anode 13 of the OLED 11 and one connection 4 to the cathode 14 of the OLED 11. A coupling terminal of a connecting element is inserted into the jack $J_1$ in the direction of the arrow.

Figure 2A:
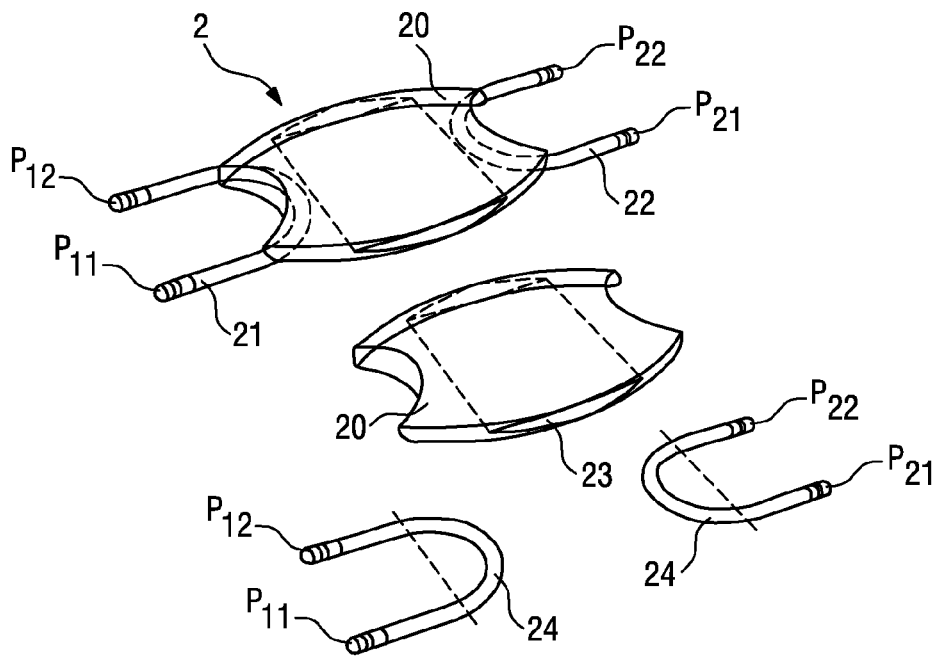
FIG. 2a shows a connecting element according to the invention in its assembled state and as an exploded view.

FIG. 2a shows a connecting element 2 according to the invention. In the upper part of the diagram, the connecting element 2 is shown in its assembled state, and in an exploded view in the lower part of the diagram The connecting element 2 comprises a body 20, which partially encloses two coupling means 21, 22. A coupling terminal is arranged at each end of each coupling means 21, 22, so that the first coupling means 21 is terminated by the coupling terminals $P_{12}$, $P_{11}$ and the second coupling means 22 is terminated by the coupling terminals $P_{22}$, $P_{21}$. In the embodiment shown, the coupling means 21 is realised in a U-shape, with a middle section 24 and two outer 'legs' or pins which are effectively parallel to each other. A coupling means 21, 22 can, as shown here, be embedded in the body 20 in the region of its middle section 24. The embedding can take place during manufacture of the body 20. In an alternative realisation, the body 20 could be made with a 'tunnel' (not shown) to later accommodate the middle section 24 of a coupling means 21, 22 which may be pushed through from one side.

Figure 2B:
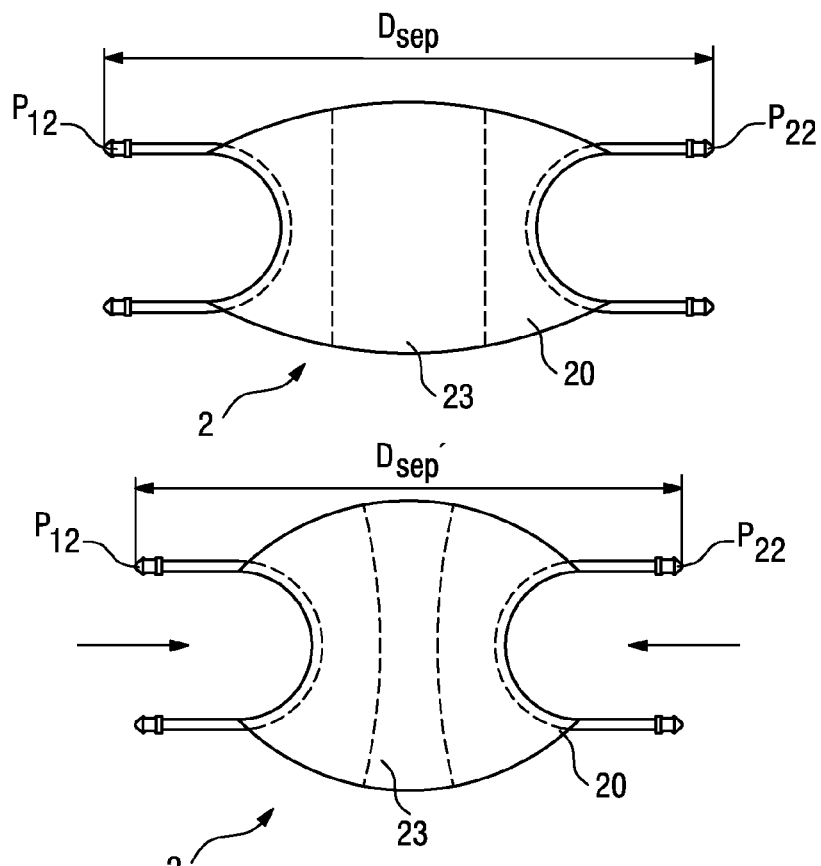
FIG. 2b shows the connecting element of FIG. 2a in a non-deformed state and in a deformed state.

The body 20 is made of a material such as a thermoplastic elastomer (TPE), and is formed so that a slit 23 or hole extends across the width of the body 20 between the coupling means 21, 22. This allows the connecting element 2 to be compressed, for example with thumb and forefinger, as illustrated in FIG. 2b. In the upper part of this diagram, the connecting element 2 is shown in its non-deformed state, where two tips $P_{12}, P_{22}$ of the two coupling means 21, 22 are separated by a distance $D_{sep}$. When the connecting element 2 is to be coupled to a lighting module as described above, a user (not shown) can grasp the connecting element 2 conveniently between thumb and forefinger and press or squeeze the connecting element 2 as indicated by the arrows so that the coupling means 21, 22 are moved towards each other in the direction of the arrows to give a reduced separation $D_{sep}'$. This reduced distance $D_{sep}'$ allows the coupling terminals $P_{11}, P_{22}$ on a shared side of the connecting element 2 to be inserted into corresponding counter-coupling means $J_1, J_2$ of the lighting module 10 described in FIG. 1a above.

Figure 2C:
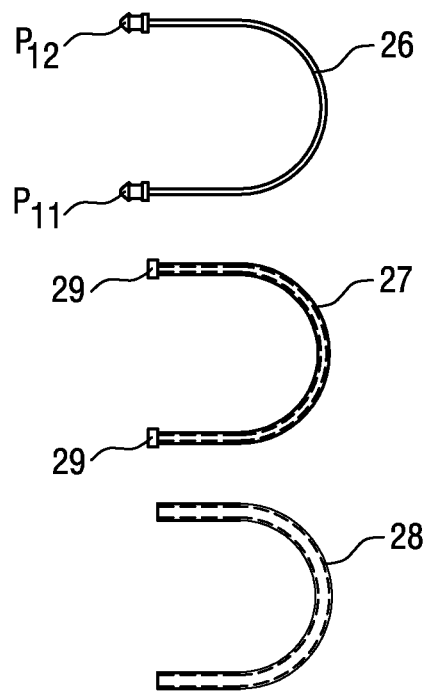
FIG. 2c shows the constituent parts of a coupling means in one embodiment of a connecting element according to the invention.

As indicated in the description of the counter-coupling means, the connectors used are two-pole connectors. FIG. 2c shows the constituent parts of a coupling means 21 of the connecting element described above. In this embodiment, the coupling means 21 consists of three layers in the manner of a co-axial connector. The first layer is given by an electrically conductive medium 26 such as copper wire. A coupling terminal $P_{12}, P_{21}$ is mounted, for example soldered, on each end of the wire 26. The first layer is surrounded by a second insulating layer 27, for example using a material such as plastic, such that the copper wire 26 is insulated while leaving the coupling terminals $P_{12}, P_{21}$ exposed. The insulating layer 27 is in turn covered by a second conducting layer 28, for example using stainless steel on account of its corrosion-resistant properties. This final layer 28 terminates, on each side, at a short distance from the ends of the insulating layer 27, so that the outer layer 28 does not come into contact with the inner conducting layer 26. The insulating sheath 27 can be terminated by rings 29 to better isolate the inner layer 26 from the outer layer 28. The first pole of the two-pole connector 21 is then given by the inner layer 26, and the second pole is given by the outer layer 28. Evidently, a second outer insulating layer (not shown) could also be implemented so that the second pole is electrically insulated.

Figure 2D:
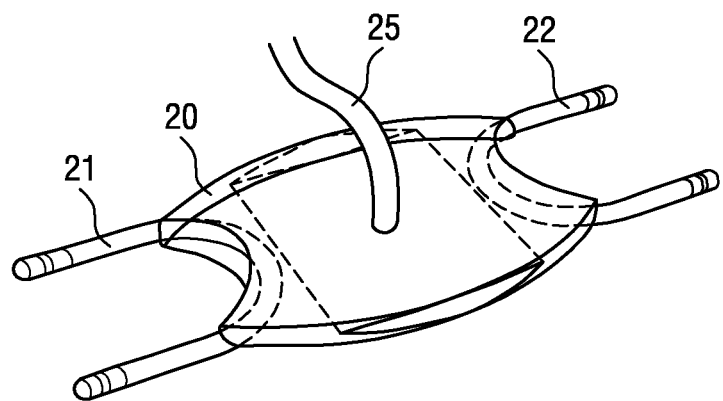
FIG. 2d shows another embodiment of a connecting element according to the invention.

FIG. 2d shows another realisation of a connecting element 2, which has a cable for connecting the coupling means to an external power supply. Two poles of the cable can be connected to the two coupling means in some suitable manner, not shown in the diagram, for example by means of suitable conductive wires embedded in the body of the connecting element. This type of power supply connection might be required, for example, if the luminaire does not have its own solar power supply. Evidently, the connection to an external power supply or to a control unit could be implemented, in a similar manner, as part of a lighting module, as described already.

Figure 3:
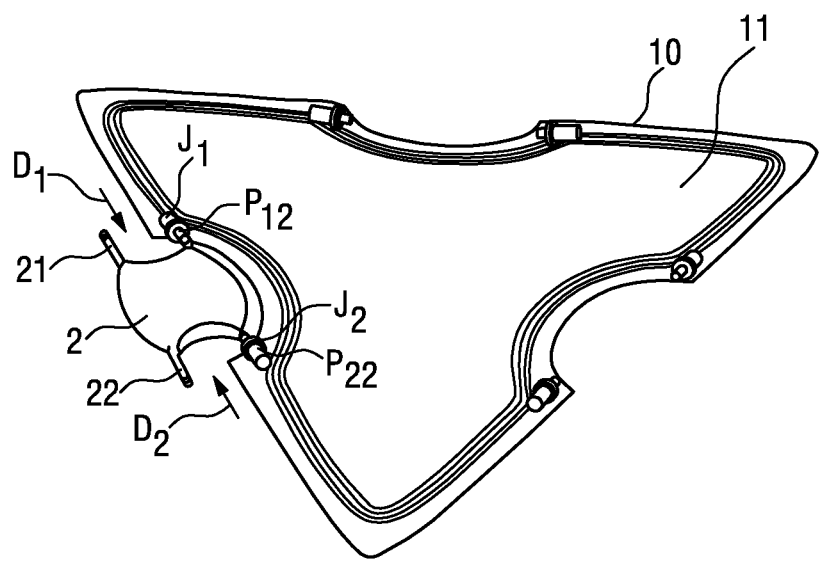

A coupling between a lighting module and a connecting element is shown in FIG. 3. Here, a connecting element 2 has been coupled to one of the three pairs of counter-coupling means $J_1, J_2$ of the lighting module 10. The connecting element 2 is coupled to the lighting module 10 by squeezing it as described above to reduce the distance between the coupling means 21, 22. The coupling terminals $P_{12}, P_{22}$ on one side of the connecting element 2 and of different coupling means 21, 22 can then easily be inserted into the corresponding counter-coupling means $J_1, J_2$. The coupling direction $D_1$ of one coupling terminal/counter-coupling means pair $P_{12}/J_1$ is anti-parallel to the coupling direction $D_2$ of the other coupling terminal/counter-coupling means pair $P_{22}/J_2$, while both coupling directions $D_1, D_2$ are essentially parallel to the coupling axis. Due to the elastic properties of the body 20, the coupling terminals $P_{12}, P_{22}$ are essentially pushed into the corresponding counter-coupling means $J_1, J_2$.

Figure 4:
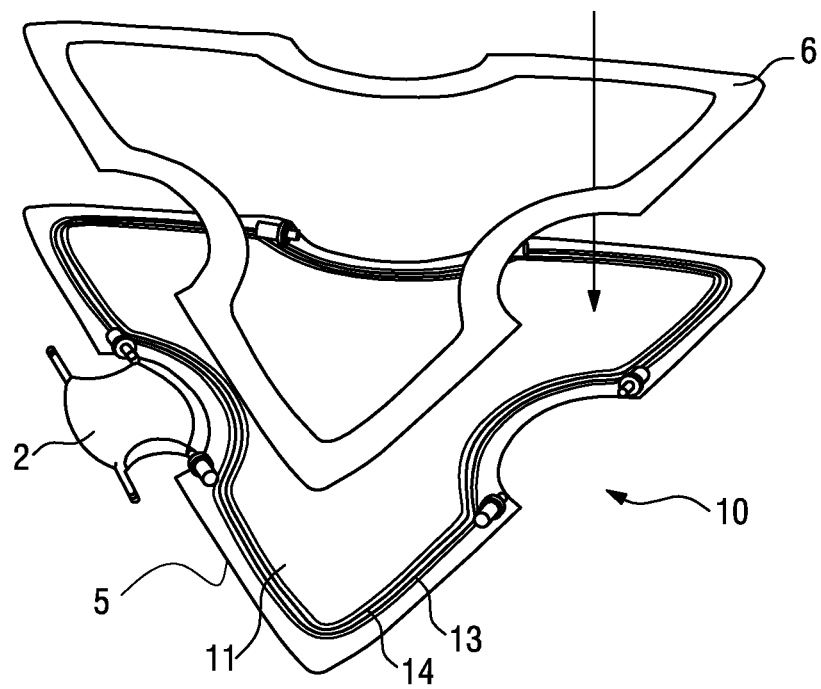

FIG. 4 is another view showing the constituent parts of the lighting module 10 of FIG. 1a, so that the details of the enclosure and OLED 11 can better be seen. The OLED 11 is manufactured with a shape appropriate to the shape of the enclosure, i.e. with three recesses corresponding to the recesses of the enclosure in this embodiment. Evidently, any other shape, suitable for a modular assembly of the lighting unit, can be used. The electrodes 13, 14 of the OLED 11 are arranged around the perimeter of the OLED 11 so that these can easily be connected to the counter-coupling means $J_1, J_2$. In the region of each counter-coupling means $J_1, J_2$, one pole 4 of the counter-coupling means $J_1, J_2$ is connected to the cathode 14 of the OLED 11, and the other pole 3 is connected to the anode 13 of the OLED 11. A connecting element 2 is shown docked to one pair of counter-coupling means on one side of the lighting module 10.

The enclosure in this example is simply a two-part frame with a lower part 5 and an upper part 6 which are attached in some suitable manner, for example by pressing the upper part 6 onto the lower part 5 in the direction of the arrow. The connection between upper and lower parts 5, 6 can be in the manner of a snap-fastener, using an interlocking lip and groove. Alternatively, upper and lower parts 5, 6 can be joined by the appropriate placement of barbs along the joining edges of the upper and lower parts 5, 6. However, to ensure that the frame cannot be inadvertently opened, the upper and lower parts 5, 6 may be permanently glued together.

In this simple realisation, the organic material of the OLED 11 is already enclosed by an upper and a lower surface, one of which is the substrate. The substrate and the other surface may comprise glass, plastic, or any other suitable material. A transparent material may be chosen, or an opaque material or a material coated on the inner side with a reflective coating. By appropriate choice of these materials, lighting modules can be obtained which emit in both directions or in one direction only.

The enclosure can, of course, also comprise such an upper or lower surface to enclose the OLED and hermetically seal it so that it is protected from moisture in the air. To further improve the seal, polyurethane foam can be applied in the upper and lower parts 5, 6 of the enclosure before these are attached to each other.

It is also conceivable that, in each recess, one of the counter-coupling means $J_1, J_2$ is a 'false' counter-coupling means, i.e. it serves only to ensure a physical connection, but no electrical connection takes place with a coupling terminal of a coupling means. Such an approach may be taken, for instance, if the costs of manufacture could be reduced by a significant amount.

FIGS. 5a-5c show first, second and third embodiments of a lighting unit 1 according to the invention, using the first, triangular, type of lighting module described above. In this and the following diagrams, for the sake of clarity, reference numbers are used shown for a single lighting module 10, light-emitting element 11, or connecting element 2. In FIG. 5a, four such triangular lighting modules 10 are connected to give a lighting unit 1 with a tetrahedral shape. Twenty lighting modules 10 are connected to give another, more elaborate, regular polyhedron form in FIG. 5b. In FIG. 5c, the lighting modules 10 are connected in a random manner to give a combination of two-dimensional and three-dimensional regions in the luminaire 1.

Figure 6A:
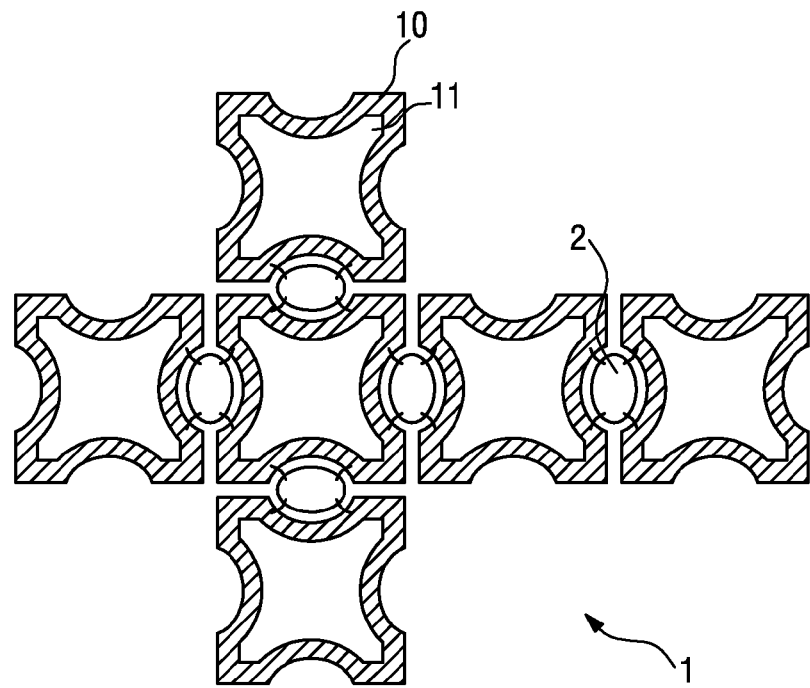
FIG. 6a shows a fourth embodiment of a lighting unit according to the invention using a second type of lighting module according to the invention.

FIG. 6a shows a fourth embodiment of a luminaire 1 according to the invention with lighting modules of a second type. Here, the lighting modules 10 are square in shape, and each lighting module 10 has four recesses, one on each side. Six lighting modules 10 are shown, connected in a planar manner, so that the overall shape of the luminaire 1 is flat. This luminaire 1 could be realised to be suspended from the ceiling. The OLEDs of one or more lighting modules 10 can be realized to emit on both sides of the lighting module 10. In this realization, five connecting elements 2 are required to connect the lighting modules 10. One of the connecting elements can be realised, in the manner of FIG. 2c, to be connected to a power supply (not shown in the diagram). The power supply connection can also serve to attach the luminaire 1 to a ceiling fixture in the usual manner.

Figure 6B:
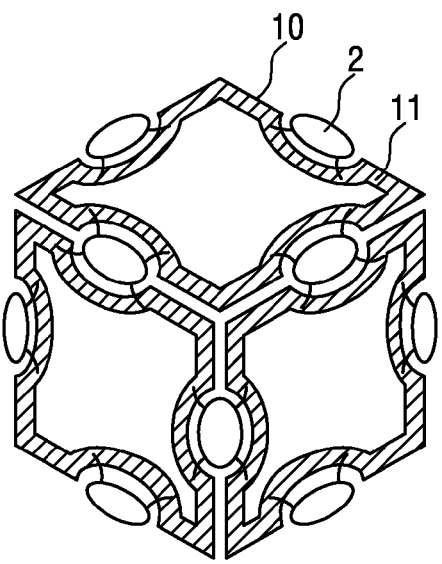
FIG. 6b shows a fifth embodiment of a lighting unit according to the invention using the second type of lighting module.

FIG. 6b shows a front view of a fifth embodiment of a luminaire 1 according to the invention, again using the 'square' lighting modules described above. Here, the six lighting modules 10 described in FIG. 6a are connected to give a cube shape, requiring twelve connecting elements 2 in all. This type of assembly could be suspended from the ceiling. Alternatively, this luminaire could be realized as a type of pedestal lamp. In a further realization, not shown, the 'bottom' lighting module could be left out, so that only five lighting modules are used, and the lighting unit can be used as a table lamp.

Figure 7:
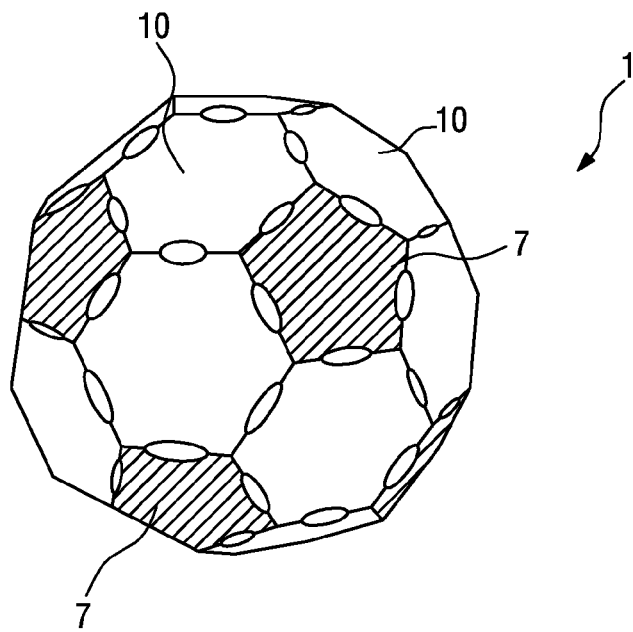
FIG. 7 shows a sixth embodiment of a lighting unit according to the invention using a third and fourth type of lighting module according to the invention.

FIG. 7 shows another luminaire 1 according to the invention, made by combining modules of two different shapes. Here, a luminaire 1 in the style of a football is assembled using a combination of hexagonal and pentagonal modules. In this embodiment, the hexagonal elements 10 can be a third type of lighting module 10, while the pentagonal elements 10 are a fourth type of lighting module 10. The pentagonal and hexagonal lighting modules 10 can be realized to emit light in the same colour or in different colours, for example according to the colours of a football club. The actual colours to be emitted by the OLED elements can be controlled by an appropriate realisation of a driving unit(s) and/or control unit, as mentioned above. Alternatively, the hexagonal elements 10 can be realized to emit white light, while the pentagonal elements can be inactive modules, serving only to contribute to the 'football' appearance of the luminaire 1. Active lighting modules 10 are connected using the connecting elements 2 described above. Obviously, any connecting elements used to connect the active modules to inactive modules need not be realized as electrically conducting connecting elements.

Figure 8:
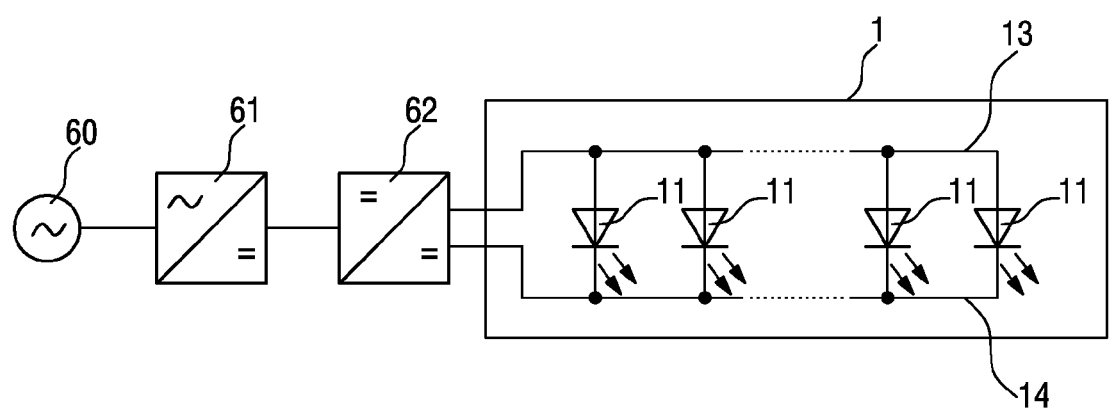

FIG. 8 shows a simplified circuit diagram representation showing how a luminaire 1 according to the invention may be connected to a power supply. Here, a power supply 60, such as the mains power supply at 230V, is connected to an AC/DC converter 61 to obtain a rectified direct current. The converter 61 is in turn connected to a transformer 62 which delivers a current at an amplitude suitable for driving the OLEDs 11 of the luminaire 1. In the circuit diagram, the OLEDs 11 are represented by the usual circuit symbol. The OLEDs 11 are connected in parallel, so that all anodes 13 are connected together, and all cathodes 14 are connected together. This 'parallel' circuit realization is given by the particular design of the counter-coupling means and the connecting elements according to the invention, so that the lighting unit cannot be connected together in an 'incorrect manner'.

Although the present invention has been disclosed in the form of a number of preferred embodiments, it is to be understood that additional modifications or variations could be made to the described embodiments without departing from the scope of the invention. For example, lighting modules intended for an 'edge' of a luminaire having an essentially two-dimensional form (such as a luminaire comprising a 'strip' of lighting modules) may be made with only one or two pairs of counter-coupling means, so that one or more sides of the lighting module can be continuous, i.e. without any visible interruption for a counter-coupling means. In this way, a 'clean' outline can be obtained.

For the sake of clarity, it is to be understood that the use of "a" or "an" throughout this application does not exclude a plurality, and "comprising" does not exclude other steps or elements. A "unit" or "module" can comprise a number of units or modules, unless otherwise stated.

The invention claimed is:

1. Lighting unit, comprising a plurality of lighting modules and a number of connecting elements with coupling means, wherein each lighting module comprises
    at least one essentially planar light-emitting element in an enclosure
    and a number of counter-coupling means arranged along at least one edge of the enclosure;
    and wherein neighbouring lighting modules are coupled together physically and detachably by means of at least one connecting element such that the light-emitting element of a first lighting module is electrically connected to the light-emitting element of a second lighting module by an interaction of at least part of the coupling means of the connecting element and at least part of the counter-coupling means of the corresponding lighting modules, wherein the coupling means of the connecting element comprises a two-pole connector comprising an electrically conducting wire as a first pole, with two ends and a coupling terminal arranged at each end; an insulating sheath surrounding the electrically conducting wire; and, as second pole, an electrically conducting outer sheath surrounding the insulating sheath.

2. Lighting unit according to claim 1, comprising a plurality of lighting modules and a number of connecting elements with coupling means, wherein each lighting module comprises a light-emitting element, an enclosure, and a number of counter-coupling means, whereby a counter-coupling means is arranged on a side of the lighting module so that a coupling axis of the counter-coupling means is essentially parallel to the side of the lighting module, and wherein neighbouring lighting modules are coupled together detachably by means of at least one connecting element such that the light-emitting element of a first lighting module is electrically connected to the light-emitting element of a second lighting module by an interaction of at least part of the coupling means of the connecting element and at least part of the counter-coupling means of the corresponding lighting modules.

3. Lighting unit according to claim 1, wherein the lighting module comprises at least one pair of counter-coupling means arranged on a side of the lighting module or on an edge of the enclosure of the lighting module.

4. Lighting unit according to claim 3, wherein the connecting element comprises a pair of coupling means, each of which comprising two coupling terminals such that two coupling terminals arranged on a shared side of the connecting element are allocated to a pair of counter-coupling means of the lighting module.

5. Lighting unit according to claim 3, wherein the counter-coupling means of a pair of counter-coupling means of a lighting module and the coupling means of a connecting element are arranged such that a first coupling direction between a coupling terminal of the first coupling means and a first counter-coupling means of the pair is essentially antiparallel to a second coupling direction between the coupling terminal of the second coupling means and the second counter-coupling means.

6. Lighting unit according to claim 1, wherein a coupling means of a connecting element comprises two coupling terminals joined by a midsection such that the two coupling terminals of a coupling means are arranged essentially parallel to each other.

7. Lighting unit according to claim 1, wherein a counter-coupling means of a lighting module comprises a socket with a first electrical contact and a second electrical contact, which socket is arranged in the enclosure of the lighting module such that the first electrical contact is connected to a first electrode of the light-emitting element, and the second electrical contact is connected to a second electrode of the light-emitting element.

8. Lighting unit according to claim 1, wherein both counter-coupling means of a pair of counter-coupling means and both coupling means of a connecting element are realized as electrical connectors.

9. Lighting unit according to claim 8, wherein the body of a connecting element comprises an elastic material.

10. Lighting unit according to claim 1, wherein the connecting element comprises coupling means and a body, realized such that the coupling means are at least partially enclosed by the body and can be pressed together to decrease a distance between a coupling terminal of one of the coupling means and a corresponding coupling terminal of the other coupling means.

11. Lighting unit according to claim 1, wherein the light-emitting element comprises at least one OLED.

12. Lighting module comprising
at least one essentially planar light-emitting element in an enclosure
and a number of counter-coupling means arranged along at least one edge of the enclosure;
wherein the counter-coupling means of the lighting module is electrically connected to the light-emitting element and is realized to accommodate a coupling means of a connecting element, wherein the coupling means of the connecting element comprises a two-pole connector comprising an electrically conducting wire as a first pole, with two ends and a coupling terminal arranged at each end; an insulating sheath surrounding the electrically conducting wire; and, as second pole, an electrically conducting outer sheath surrounding the insulating sheath.

13. Lighting module according to claim 12, comprising
at least one light-emitting element
and a number of counter-coupling means arranged on at least one side of the lighting module,
wherein a counter-coupling means is electrically connected to the light-emitting element and realized to accommodate a coupling means of a connecting element and wherein the counter-coupling means is arranged on a side of the lighting module such that a coupling axis of the counter-coupling means is essentially parallel to the side of the lighting module.

14. Lighting unit, comprising:
a plurality of lighting modules, wherein each lighting module comprises: (i) at least one essentially planar light-emitting element in an enclosure; and (ii) a number of counter-coupling means arranged along at least one edge of the enclosure; and
a number of connecting elements with coupling means;

wherein neighbouring lighting modules are coupled together physically and detachably by means for rotational movement about a coupling axis of at least one connecting element such that the light-emitting element of a first lighting module is electrically connected to the light-emitting element of a second lighting module by an interaction of at least part of the coupling means of the connecting element and at least part of the counter-coupling means of the corresponding lighting modules;
wherein the coupling means of the connecting element simultaneously exerts a first force against said first and second lighting module, and a second force against said first and second lighting module, the first force and second force oriented in opposite directions along said coupling axis.

15. Lighting unit according to claim 14, comprising a plurality of lighting modules and a number of connecting elements with coupling means, wherein each lighting module comprises a light-emitting element, an enclosure, and a number of counter-coupling means, whereby a counter-coupling means is arranged on a side of the lighting module so that the coupling axis of the counter-coupling means is essentially parallel to the side of the lighting module, and wherein neighbouring lighting modules are coupled together detachably by means of at least one connecting element such that the light-emitting element of a first lighting module is electrically connected to the light-emitting element of a second lighting module by an interaction of at least part of the coupling means of the connecting element and at least part of the counter-coupling means of the corresponding lighting modules.

16. Lighting unit according to claim 14, wherein the lighting module comprises at least one pair of counter-coupling means arranged on a side of the lighting module or on an edge of the enclosure of the lighting module.

17. Lighting unit according to claim 16, wherein the connecting element comprises a pair of coupling means, each of which comprising two coupling terminals such that two coupling terminals arranged on a shared side of the connecting element are allocated to a pair of counter-coupling means of the lighting module.

18. Lighting unit according to claim 16, wherein the counter-coupling means of a pair of counter-coupling means of a lighting module and the coupling means of a connecting element are arranged such that a first coupling direction between a coupling terminal of the first coupling means and a first counter-coupling means of the pair is essentially anti-parallel to a second coupling direction between the coupling terminal of the second coupling means and the second counter-coupling means.

19. Lighting unit according to claim 14, wherein a coupling means of a connecting element comprises two coupling terminals joined by a midsection such that the two coupling terminals of a coupling means are arranged essentially parallel to each other.

20. Lighting unit according to claim 14, wherein a counter-coupling means of a lighting module comprises a socket with a first electrical contact and a second electrical contact, which socket is arranged in the enclosure of the lighting module such that the first electrical contact is connected to a first electrode of the light-emitting element, and the second electrical contact is connected to a second electrode of the light-emitting element.

21. Lighting unit according to claim 14, wherein both counter-coupling means of a pair of counter-coupling means and both coupling means of a connecting element are realized as electrical connectors.

22. Lighting unit according to claim 21, wherein the body of a connecting element comprises an elastic material.

23. Lighting unit according to claim 14, wherein the connecting element comprises coupling means and a body, realized such that the coupling means are at least partially enclosed by the body and can be pressed together to decrease a distance between a coupling terminal of one of the coupling means and a corresponding coupling terminal of the other coupling means.

24. Lighting unit according to claim 14, wherein a coupling means of a connecting element comprises a two-pole connector comprising
- an electrically conducting wire as a first pole, with two ends and a coupling terminal arranged at each end;
- an insulating sheath surrounding the electrically conducting wire;
- and, as second pole, an electrically conducting outer sheath surrounding the insulating sheath.

25. Lighting unit according to claim 14, wherein the light-emitting element comprises at least one OLED.

26. Lighting module comprising:
- at least one essentially planar light-emitting element in an enclosure; and
- a number of counter-coupling means arranged along at least one edge of the enclosure;
- wherein the counter-coupling means of the lighting module is electrically connected to the light-emitting element and is realized to accommodate a coupling means of a connecting element by means for rotational movement about a coupling axis;
- wherein the coupling means of the connecting element simultaneously exerts a first force against the light-emitting element, and a second force against the light-emitting element, the first force and second force oriented in opposite directions along said coupling axis.

27. Lighting module according to claim 26, comprising
at least one light-emitting element
and a number of counter-coupling means arranged on at least one side of the lighting module,
wherein a counter-coupling means is electrically connected to the light-emitting element and realized to accommodate a coupling means of a connecting element and wherein the counter-coupling means is arranged on a side of the lighting module such that the coupling axis of the counter-coupling means is essentially parallel to the side of the lighting module.

* * * * *